United States Patent
Enzmann et al.

(10) Patent No.: US 9,608,401 B2
(45) Date of Patent: Mar. 28, 2017

(54) METHOD FOR PRODUCING SEMICONDUCTOR LASER ELEMENTS AND SEMI-CONDUCTOR LASER ELEMENT

(71) Applicant: OSRAM OPTO SEMICONDUCTORS GMBH, Regensburg (DE)

(72) Inventors: Roland Enzmann, Regensburg (DE); Markus Horn, Straubing (DE); Markus Graul, Regensburg (DE); Thomas Veit, Mintraching (DE); Juergen Dachs, Baar-Ebenhausen (DE); Stefan Listl, Pettendorf (DE); Markus Arzberger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/653,698

(22) PCT Filed: Dec. 17, 2013

(86) PCT No.: PCT/EP2013/076953
§ 371 (c)(1),
(2) Date: Jun. 18, 2015

(87) PCT Pub. No.: WO2014/095903
PCT Pub. Date: Jun. 26, 2014

(65) Prior Publication Data
US 2015/0349487 A1   Dec. 3, 2015

(30) Foreign Application Priority Data
Dec. 18, 2012   (DE) .................. 10 2012 112 531

(51) Int. Cl.
 H01S 5/02   (2006.01)
 H01S 5/323  (2006.01)
 H01S 5/022  (2006.01)

(52) U.S. Cl.
 CPC .......... *H01S 5/0201* (2013.01); *H01S 5/0206* (2013.01); *H01S 5/02236* (2013.01);
 (Continued)

(58) Field of Classification Search
 CPC .. H01S 5/0201; H01S 5/0206; H01S 5/02236; H01S 5/32333; H01S 5/02272
 See application file for complete search history.

(56) References Cited

U.S. PATENT DOCUMENTS

| 4,997,792 A | 3/1991 | McClurg |
| 5,920,584 A | 7/1999 | Dohle et al. |

(Continued)

FOREIGN PATENT DOCUMENTS

| DE | 10 2005 053 274 | 4/2007 |
| DE | 10 2012 107 409 | 2/2014 |

(Continued)

OTHER PUBLICATIONS

Examination Report issued in corresponding Japanese application dated May 24, 2016.

*Primary Examiner* — Armando Rodriguez
(74) *Attorney, Agent, or Firm* — Cozen O'Connor

(57) ABSTRACT

Method for producing semiconductor laser elements (1) comprises A) providing a carrier composite (20) having a plurality of carriers (2) for the semiconductor laser elements (1), B) providing a laser bar (30) having a plurality of semiconductor laser diodes (3) which comprise a common growth substrate (31) and a semiconductor layer sequence (32) grown thereon, C) generating predetermined breaking points (35) on a substrate underside (34) of the growth (Continued)

substrate (31), said substrate underside facing away from the semiconductor layer sequence (32), D) attaching the laser bar (30) to a carrier upper side (23) of the carrier composite (20), wherein the attachment is performed at an elevated temperature and is followed by cooling, and E) singulating into the semiconductor laser elements (1), wherein steps B) to E) are performed in the indicated sequence.

17 Claims, 3 Drawing Sheets

(52) U.S. Cl.
CPC ...... *H01S 5/02272* (2013.01); *H01S 5/32333* (2013.01); *H01S 5/0202* (2013.01); *H01S 5/0226* (2013.01); *H01S 5/02268* (2013.01); *H01S 5/323* (2013.01)

(56) References Cited

U.S. PATENT DOCUMENTS

| | | |
|---|---|---|
| 6,048,747 A | 4/2000 | Chakrabarti et al. |
| 2002/0172244 A1 | 11/2002 | Li et al. |
| 2005/0003572 A1 | 1/2005 | Hahn et al. |
| 2009/0230514 A1 | 9/2009 | Kohda |
| 2010/0012246 A1 | 1/2010 | Hayot |
| 2010/0124246 A1* | 5/2010 | Lutgen ................ H01L 33/0095 372/50.1 |
| 2012/0326178 A1* | 12/2012 | Fehrer .................... H01L 24/24 257/88 |

FOREIGN PATENT DOCUMENTS

| | | |
|---|---|---|
| JP | S56-6451 | 1/1981 |
| JP | S60 123086 | 7/1985 |
| JP | H03 286547 | 12/1991 |
| JP | H06 5703 | 1/1994 |
| JP | H10 125958 | 5/1998 |
| JP | H11 220204 | 8/1999 |
| JP | 2002 232061 | 8/2002 |
| JP | 2005-123329 | 5/2005 |
| JP | 2011 249401 | 12/2011 |

* cited by examiner

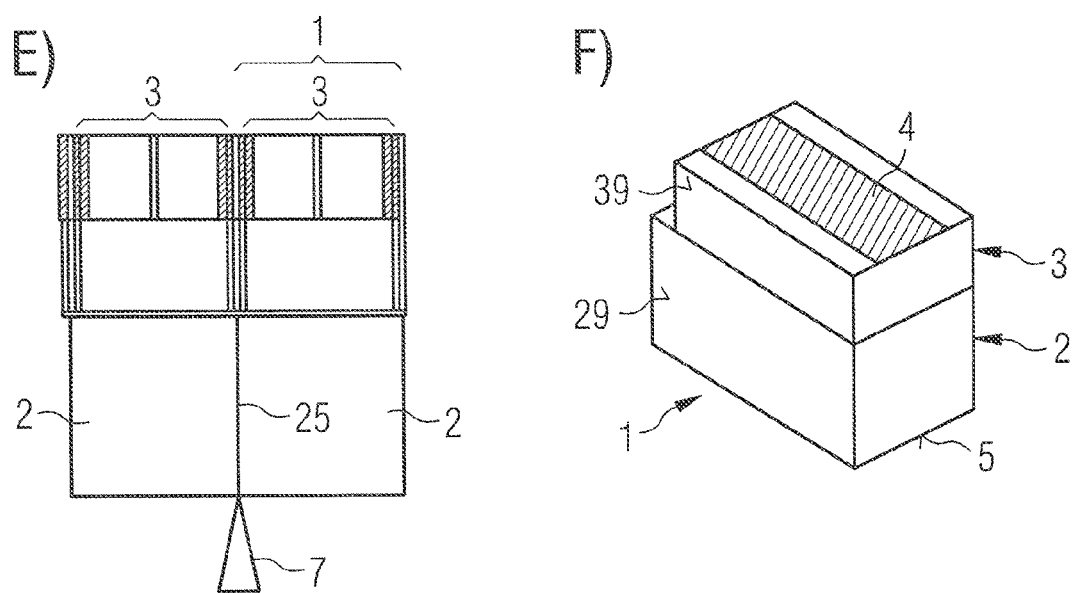

A)

B)

C)

D)

METHOD FOR PRODUCING SEMICONDUCTOR LASER ELEMENTS AND SEMI-CONDUCTOR LASER ELEMENT

RELATED APPLICATIONS

This is a U.S. National Phase Application under 35 USC 371 of International Application PCT/EP2013/076953 filed on Dec. 17, 2013.

This application claims the priority of German application no. 10 2012 112 531.7 filed Dec. 18, 2012, the entire content of which is hereby incorporated by reference

FIELD OF THE INVENTION

A method for producing semiconductor laser elements is provided. A correspondingly produced semiconductor laser element is also provided.

SUMMARY OF THE INVENTION

An object to be achieved is to provide a method, by means of which a plurality of semiconductor laser elements can be produced in an efficient and precise manner.

In accordance with at least one embodiment, the method comprises the step of providing at least one carrier composite. A plurality of carriers are combined in the carrier composite, wherein the carriers are provided for the finished semiconductor laser elements. For example, the carrier composite is a strip of a thermally conductive material which is configured for being subdivided into the individual carriers.

In accordance with at least one embodiment, the method comprises the step of providing one or several laser bars. The at least one laser bar comprises a plurality of semiconductor laser diodes. The semiconductor laser diodes are applied within the laser bar on a common growth substrate. A semiconductor layer sequence for the semiconductor laser diodes is produced on this growth substrate. Preferably, the semiconductor layer sequence is contiguous and is epitaxially grown as a continuous layer onto the growth substrate, in particular directly and in direct contact.

In accordance with at least one embodiment, the semiconductor layer sequence comprises an n-type side and a p-type side. The n-type side is n-type conducting and the p-type side is p-type conducting. Located between the n-type side and the p-type side is at least one active zone for producing a laser radiation during operation of the finished semiconductor laser element. It is possible that during the production process further mechanically supporting components are used at times as auxiliary carriers on the laser bar.

In accordance with at least one embodiment, the n-type side is located in closer proximity to the growth substrate than the p-type side. The n-type side and the p-type side are preferably formed in each case in a planar and continuous manner and are oriented perpendicularly with respect to a growth direction of the semiconductor layer sequence. A thickness of the semiconductor layer sequence is preferably at least 2 µm or 4 µm and/or at the most 18 µm or 12 µm.

In accordance with at least one embodiment, the method comprises the step of generating at least one predetermined breaking point on a substrate underside of the growth substrate, said substrate underside facing away from the semiconductor layer sequence. Preferably, a plurality of predetermined breaking points are formed. Each of the predetermined breaking points lies in a singulation region which separates adjacent semiconductor laser diodes from one another. In other words, the singulation region is such a region in which the laser bar is separated to form the individual semiconductor laser diodes. Preferably, precisely one predetermined breaking point is provided in each singulation region and therefore between two semiconductor laser diodes in each case.

In accordance with at least one embodiment, the method comprises the step of attaching the laser bar to the carrier composite. The laser bars are attached to a carrier upper side, wherein the substrate underside faces towards the carrier upper side. The semiconductor layer sequence is then located on a side of the growth substrate facing away from the carrier composite.

In accordance with at least one embodiment, the laser bar is attached to the carrier composite at an elevated temperature compared to room temperature. For example, this temperature is at least 200° C. or 250° C. or 280° C. or 300° C. or 330° C. During attachment, the laser bar is mechanically and/or electrically contacted with the carrier composite. In each case, precisely one of the semiconductor laser diodes is allocated to precisely one of the carriers from the carrier composite.

In accordance with at least one embodiment, attachment of the laser bar is followed by cooling. In comparison with the attachment, a temperature of the laser bar and of the carrier composite is reduced, e.g. to room temperature, i.e. approximately 300 K.

In accordance with at least one embodiment, the method comprises the step of singulating to form the semiconductor laser elements. After singulation, the semiconductor laser elements are separated from one another mechanically and electrically and can be handled in particular individually and independently of one another. Preferably, each of the semiconductor laser elements comprises in each case precisely one of the semiconductor laser diodes and precisely one of the carriers from the carrier composite.

In accordance with at least one embodiment, the step of providing the laser bar is performed prior to the step of generating the predetermined breaking points. Furthermore, the step of generating the predetermined breaking points is performed prior to the step of attaching the laser bars. Finally, the step of attaching the laser bar is performed in particular prior to the singulation into the semiconductor laser elements.

In at least one embodiment, the method is configured for producing semiconductor laser elements. The method comprises the steps of:
A) providing at least one carrier composite having a plurality of carriers for the semiconductor laser elements,
B) providing at least one laser bar having a plurality of semiconductor laser diodes which comprise a common growth substrate and a semiconductor layer sequence grown thereon, wherein the semiconductor layer sequence comprises an n-type side, a p-type side and an active zone located therebetween and wherein the n-type side faces towards the growth substrate,
C) generating predetermined breaking points on a substrate underside of the growth substrate, said substrate underside facing away from the semiconductor layer sequence,
D) attaching the laser bar to a carrier upper side of the carrier composite, wherein the substrate underside faces towards the carrier upper side and wherein the attachment is performed at an elevated temperature and is followed by cooling, and
E) singulating into the semiconductor laser elements, wherein steps B) to E) are performed in the indicated sequence.

In step D), preferably precisely one of semiconductor laser diodes is allocated in each case to precisely one of the carriers from the carrier composite.

During mounting of laser diodes, in particular single-mode laser diodes, often only small production tolerances are permitted and a precise adjustment of the laser is required. This is the case in particular if laser radiation from the semiconductor laser diode is to be coupled into a light guide. For instance, for radiation in the near-infrared spectral range, a mode field diameter of a light guide in the single-mode regime is approximately 4 μm to 4.5 μm. In order to achieve effective optical coupling between a light guide and a semiconductor laser element, production tolerances of ≤3 μm or ≤2 μm are required.

In this case, within the scope of the production process the individual semiconductor laser diodes which are grown e.g. epitaxially on a larger wafer are to be singulated and attached to a carrier. In order subsequently to simplify the adjustment of the semiconductor laser element, it is necessary for the semiconductor laser diode to be mounted on the carrier in a precise manner relative to the carrier.

Such precise mounting of the semiconductor laser diode is effected in particular using a component placement machine, i.e. a die bonder. At the required high level of precision, a throughput of such placement machines is in the order of magnitude of 500 to 1000 units/hour. Therefore, the placement is a significant cost factor during production.

In accordance with the production method stated above, the singulation of the laser bar into the semiconductor laser diodes is performed only after attachment to the carrier composite. As a result, the laser bar and the carrier composite as a whole can be adjusted precisely with respect to one another. Therefore, a plurality of semiconductor laser diodes can be simultaneously positioned relative to the carrier composite and the associated carriers, for instance using a placement machine. Therefore, the throughput of semiconductor laser elements, in relation to the capacity of a placement machine, can be increased approximately by a factor corresponding to the number of semiconductor laser diodes in the laser bar. It is thus possible to achieve a significant cost reduction during production.

In accordance with at least one embodiment, the finished semiconductor laser elements are edge-emitting lasers. An emission direction of the laser diodes is oriented preferably perpendicularly with respect to an end side. The end side is preferably also oriented in parallel with a growth direction of the semiconductor layer sequence and perpendicularly with respect to the lateral surfaces of the growth substrate and of the carrier. In this case, singulation from the laser bar and from the carrier composite into the semiconductor laser elements is effected on the lateral surfaces. The end side can be oriented perpendicularly with respect to a resonator or a longitudinal direction of the resonator of the laser diodes.

In accordance with at least one embodiment, the carrier composite is manufactured from a semiconductor material. Preferably, the carrier composite is a silicon carrier. The silicon carrier can be doped or even undoped. Accordingly, the carrier composite can be configured to be electrically conductive or even electrically insulating.

In accordance with at least one embodiment, the growth substrate is a GaAs substrate. The growth substrate can likewise be doped or undoped.

In accordance with at least one embodiment, the semiconductor layer sequence and/or the semiconductor laser diodes are based on $Al_nIn_{1-n-m}Ga_mAs$ where $0 \leq n \leq 1$, $0 \leq m \leq 1$ and $n+m \leq 1$. The semiconductor layer sequence can comprise dopants. The semiconductor laser diode is preferably configured for an emission of laser radiation in the wavelength range between 790 nm and 890 nm inclusive or 805 nm and 855 nm inclusive.

Likewise, it is possible that the semiconductor laser diode is based on the material system AlInGaN or InP or AlInGaAsP. An emission wavelength is then in the ultraviolet or blue spectral range or in the near-infrared spectral range, e.g. between 1.3 μm and 1.5 μm inclusive.

In accordance with at least one embodiment, the laser bar is attached to the carrier composite by soldering. As an alternative thereto, a different, thermally induced connecting method can be employed, for instance a thermocompression method. Electrically conductive adhesion using a thermally curing adhesive is also possible.

In accordance with at least one embodiment, the predetermined breaking points in the growth substrate are produced by means of scribing, sawing and/or laser irradiation.

In accordance with at least one embodiment, during cooling a temperature of the mutually connected laser bars and of the carrier composite is reduced by at least 250° C. or 200° C. As a result, thermal stresses are induced between the laser bar and the carrier composite.

In accordance with at least one embodiment, during cooling the laser bar is singulated at least partially into the semiconductor laser diodes. That is to say, by reason of the thermally induced stresses during cooling, the laser bar can break at the previously provided predetermined breaking points in the growth substrate. As a result, bending of the carrier composite during cooling can be avoided or reduced.

Furthermore, further production steps can also be performed more simply. The lack of bending permits more precise production and singulation.

In accordance with at least one embodiment, during cooling only the laser bar is singulated and the carrier composite is retained. Then, in this step no mechanical separation is effected between adjacent carriers of the carrier composite.

In accordance with at least one embodiment, after the step of attaching the laser bar to the carrier composite at least one predetermined breaking point is formed between adjacent carriers. Preferably, precisely one predetermined breaking point is located between two adjacent carriers in each case. It is possible that the predetermined breaking point is generated by means of coherent radiation, i.e. laser radiation. Alternatively, the predetermined breaking point can be formed by scribing or sawing or etching.

In accordance with at least one embodiment, during singulation the carrier composite is separated into the carriers by breaking. The breaking is effected preferably via a breaking edge which is placed against a carrier underside facing away from the semiconductor layer sequence.

In accordance with at least one embodiment, the predetermined breaking point in the carrier composite extends at least 25% or 40% through the carrier composite, in the direction perpendicular to the upper side. Alternatively or in addition, the predetermined breaking point extends at the most 75% or 60% through the carrier composite. When the predetermined breaking point is created in this manner, a mechanical integrity between adjacent carriers is preferably not destroyed or not completely destroyed.

In accordance with at least one embodiment, the finished semiconductor laser elements have a total thickness. The total thickness is to be understood to be the sum of the thicknesses of the carriers and of the growth substrate. The thickness of any electrical contacting and a thickness of semiconductor layer sequence itself are disregarded in this case.

In accordance with at least one embodiment, a quotient of the total thickness and of a width of the carrier is at least 0.8. The width of the carrier is oriented perpendicularly with respect to the growth direction of the semiconductor layer sequence and perpendicularly with respect to a main emission direction of the semiconductor laser diodes.

In accordance with at least one embodiment, a quotient of a length of the carrier and of the width of the carrier is at least 1.2. The length is oriented in parallel with the main emission direction.

In accordance with at least one embodiment, the finished semiconductor laser elements have a width of at least 100 µm or 150 µm and/or of at the most 350 µm or 250 µm.

Alternatively or in addition, a length of the finished semiconductor laser elements, in the direction in parallel with the main emission direction, is at least 175 µm or 250 µm and/or at the most 700 µm or 500 µm.

In accordance with at least one embodiment, the total thickness of the semiconductor laser elements, in the direction perpendicular to the carrier upper side, is at least 125 µm or 200 µm. Alternatively or in addition, the total thickness is at the most 600 µm or 450 µm or 350 µm.

In accordance with at least one embodiment, in the step of attaching the laser bar to the carrier composite, said laser bar has a length of at least 5 mm or 7 mm and/or of at the most 20 mm or 15 mm, in particular approximately 10 mm. The length is oriented perpendicularly with respect to the main emission direction and perpendicularly with respect to the growth direction of the semiconductor layer sequence.

In accordance with at least one embodiment, after step E) lateral surfaces of the fragmented growth substrate, lateral surfaces of the semiconductor layer sequence and/or lateral surfaces of the singulated carriers are oriented in parallel with one another. Furthermore, the carrier, the fragmented growth substrate and the semiconductor layer sequence within one of the semiconductor laser diodes or semiconductor laser elements preferably have equal widths. Furthermore, the lateral surfaces of the fragmented growth substrate and of the carriers terminate preferably flush with one another. The lateral surfaces of the carrier and of the fragmented growth substrate can lie in a common plane. The aforementioned geometric properties are preferably produced with a tolerance of at the most 6 µm or 4 µm or 2 µm.

In accordance with at least one embodiment, the carrier composite protrudes beyond the laser bar at a rear side opposite to the end side. The carrier composite then protrudes over the laser bar at the rear side.

In accordance with at least one embodiment, the sub-region of the carrier composite protruding beyond the laser bar forms a holding strip at the rear side. The adjacent carriers are still mechanically coupled by means of the holding strip even after the predetermined breaking points have been created in the carrier composite or after adjacent carriers have been mechanically separated directly from one another. Such a holding strip is present in particular in step D).

In accordance with at least one embodiment, the holding strip is partially or completely removed. The holding strip is then no longer present or only partially present in the finished semiconductor laser elements.

In accordance with at least one embodiment, thermal expansion coefficients of the growth substrate and of the carrier composite differ from one another by at least a factor of 1.5 or 2 or 2.5. As a result, it is possible that sufficiently large thermal stresses are induced during cooling so that the laser bar can be singulated automatically.

In accordance with at least one embodiment, metallisations are applied to the carrier upper side and/or to the substrate underside. It is possible that precisely one metallisation is provided for each carrier and for each of the semiconductor laser diodes. The metallisations are spaced apart from the singulation regions between adjacent semiconductor laser diodes and thus do not form a continuous layer. Preferably, the metallisation is configured for being connected to a further component by soldering.

In accordance with at least one embodiment, a quotient from the length of the laser bar and a bending of the carrier composite during the entire process is at least 1200 or 1500 or 2000. In other words, the carrier composite then does not undergo any significant bending, in relation to the entire length of the laser bar.

In accordance with at least one embodiment, the laser bar comprises in step D) at least ten or 15 or 25 semiconductor laser diodes. Alternatively or in addition, the laser bar comprises at the most 60 or 50 semiconductor laser diodes.

A semiconductor laser element is also provided. The semiconductor laser element is produced by a method, as described above. Features of the method are thus also disclosed for the semiconductor laser element, and vice versa.

In at least one embodiment, the semiconductor laser element comprises a carrier having an end side and a carrier upper side oriented preferably perpendicularly with respect thereto. Furthermore, the semiconductor laser element comprises a semiconductor laser diode which comprises a growth substrate and a semiconductor layer sequence for generating laser radiation. The semiconductor laser diode is attached to the carrier upper side. The carrier and the semiconductor laser diode have equal widths and lateral surfaces of the carrier and of the semiconductor laser diode terminate flush with one another and are oriented preferably in parallel with one another, in particular with a tolerance of at the most 6 µm or 4 µm or 2 µm. The lateral surfaces comprise singulation tracks. Preferably, the semiconductor laser element comprises precisely one carrier and precisely one semiconductor laser diode.

The fact that the lateral surfaces comprise singulation tracks can mean that the lateral surfaces, after being singulated into the semiconductor laser elements, cannot subsequently be ground or polished. The singulation tracks can be formed as a roughening of the lateral surfaces. In particular, tracks from laser-machining or scribing the semiconductor layer sequence or the growth substrate can be seen on the lateral surfaces.

BRIEF DESCRIPTION OF THE DRAWINGS

A method described herein and a semiconductor laser element described herein will be described in greater detail hereinafter with reference to the drawings using exemplified embodiments. Like reference numerals designate like elements in the individual figures. None of the references are illustrated to scale, instead, in order to improve understanding, individual elements can be illustrated excessively large.

DETAILED DESCRIPTION OF THE DRAWINGS

Figure 1:
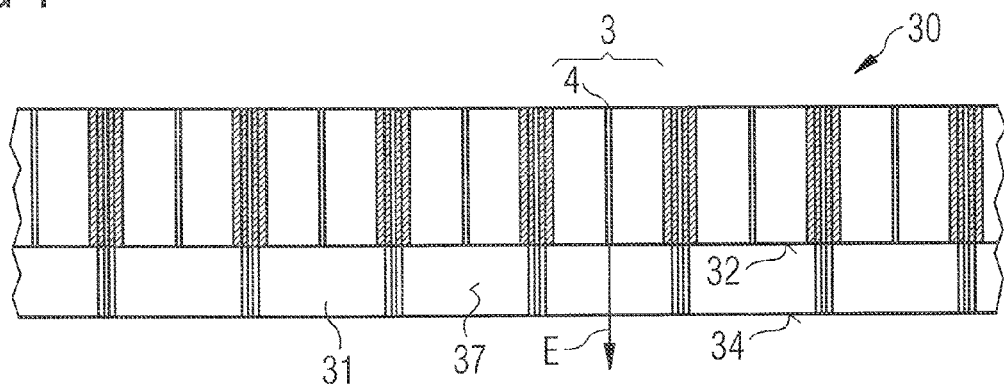
FIGS. 1A to 1F show a schematic view of a method described herein for producing semiconductor laser elements described herein.
Figure 1:
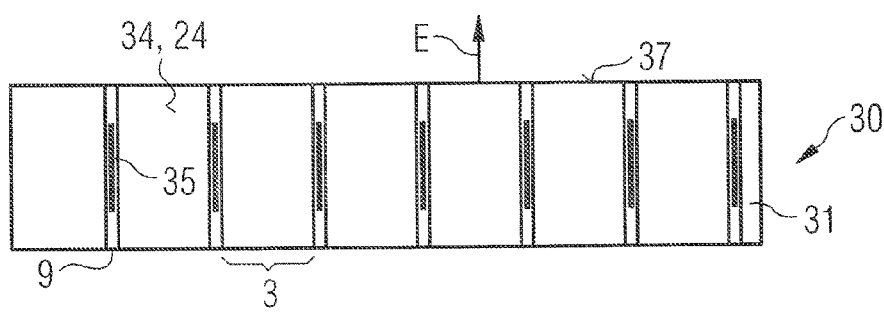
Figure 1:
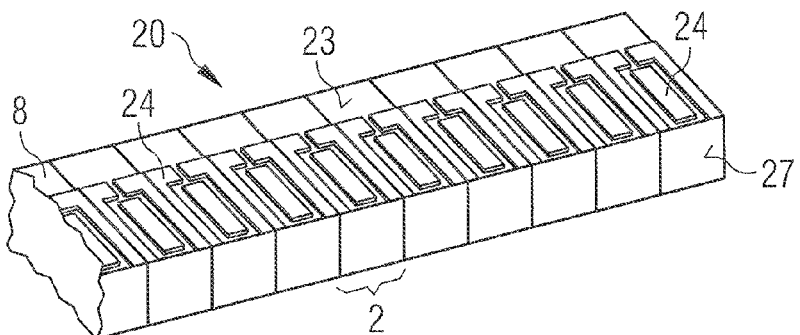
Figure 1:
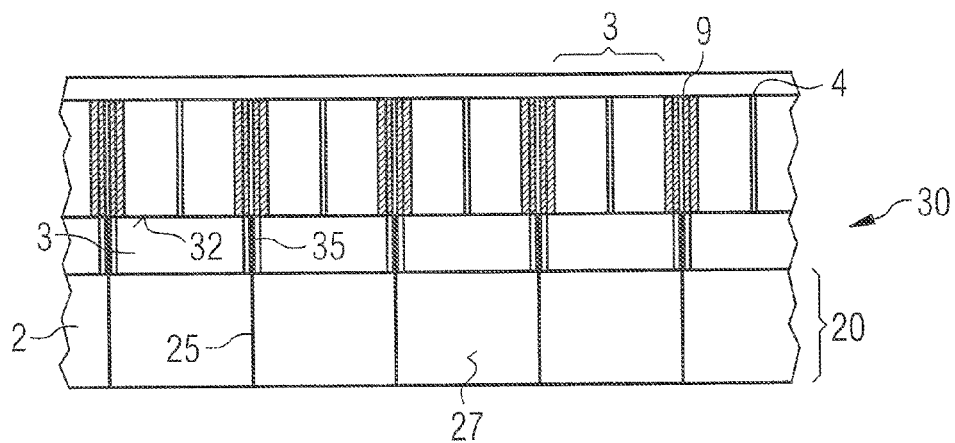

FIGS. 1A to 1F illustrate a method for producing semiconductor laser elements 1. In accordance with the perspective view in FIG. 1A, a laser bar 30 is provided. The laser bar 30 comprises a growth substrate 31 and a semiconductor layer sequence 32 which is applied thereto and has at least one active zone. The semiconductor layer sequence 32 is epitaxially grown and faces away from a substrate underside 34. Located on the same side of the growth substrate 31 as the semiconductor layer sequence 32 are contact points 4 for electrically contacting the semiconductor layer sequence 32. The contact points 4 are e.g. solder pads.

The laser bar 30 comprises a plurality of semiconductor laser diodes 3. Singulation regions 9 are located between adjacent semiconductor laser diodes 3. During subsequent singulation, the semiconductor laser diodes 3 are separated from one another in the singulation regions 9, see also FIG. 1E. Preferably, none of the contact points 4 are located in the singulation regions 9.

The laser diodes 3 are preferably configured for emitting a laser radiation at a front side 37. The front side 37 is oriented perpendicularly with respect to a growth direction and perpendicularly with respect to a main emission direction E.

FIG. 1B illustrates a schematic bottom view of the laser bar 30, as shown in FIG. 1A. At the substrate underside 34, the laser diodes 3 are preferably provided in each case with a metallisation 24. The metallisation 24 on the undersides 34 is also restricted in each case to precisely one of the laser diodes 3. A predetermined breaking point 35 is located in each case in the singulation regions 9. The predetermined breaking point 35 is spaced apart from the metallisations 24. For example, the predetermined breaking point 35 is produced by scribing the growth substrate 31.

Preferably, the predetermined breaking points 35 do not extend as far as the front side 37 and a rear side of the laser bar 30 opposite to the front side. A length of the predetermined breaking points 35, in the direction in parallel with the main emission direction E, is e.g. at least 25% or 50% or 60% and/or at the most 90% or 80% or 75% of a length of the laser diodes 3, in relation to a total length of the laser diodes 3 along the main emission direction E.

During the method step, as illustrated in the perspective view in FIG. 1A, a carrier composite 20 is provided. The carrier composite 20 includes a plurality of carriers 2 which are mechanically integrated with one another in the carrier composite 20. The carrier composite 20 comprises an end side 27 and a carrier upper side 23 which is oriented perpendicularly with respect thereto.

The carrier upper side 23 is provided with metallisations 24. The metallisations 24 are formed e.g. in each case from a titanium layer, a platinum layer and a gold layer which follow one another in the direction away from the carrier composite 20. In T-shaped regions, the carrier upper side 23 is exposed in places, no metallisation is applied in these regions. The metallisations 24 can also be formed by, or comprise, AuSn.

The carrier composite 20 is manufactured e.g. from a silicon wafer. A thickness of the carrier composite 20, in the direction perpendicular to the carrier upper side 23, is e.g. approximately 200 μm. A width of the carrier composite 20 is in particular between 10 mm and 30 mm inclusive, e.g. ca. 20.8 mm. A length of the carrier composite 20 is e.g. between 0.7 mm and 2.0 mm inclusive, in particular ca. 1.2 mm.

In accordance with the method step, as illustrated in the perspective view in FIG. 1D, the laser bar 30 is attached to the carrier composite 20. This attachment is effected by soldering at a temperature of approximately 300° C. After attachment, the predetermined breaking points 35 are located in the growth substrate 31 between the semiconductor layer sequence 32 and the carriers 2. The predetermined breaking points 35 are oriented approximately perpendicularly with respect to a boundary surface between the laser bar 30 and the carrier composite 20 and can extend in parallel with the main emission direction E. The predetermined breaking point 35 is located in closer proximity to an n-type side of the semiconductor layer sequence 32 than a p-type side.

After attaching the laser bar 30 to the carrier composite 20, cooling is effected. Cooling produces stresses within the growth substrate 31 and also within the carrier composite 20. If the growth substrate 31 is based on GaAs having a thermal expansion coefficient of approximately 6.9 ppm/K and if the carrier composite 20 is based on silicon having an expansion coefficient of approximately 2.6 ppm/K, then during cooling the growth substrate 31 contracts more than the carrier composite 20. The starting point in this case is a temperature at which the laser bar 30 is fixedly joined to the carrier composite 20, e.g. a solidification temperature of a solder.

By reason of the thermal stresses which occur, the growth substrate 31 and the semiconductor layer sequence 32 are fragmented in the singulation regions 9 along the predetermined breaking points 35 in the growth substrate 31 or at least along some of these predetermined breaking points 35. In other words, during cooling the laser bar 30 is at least partially singulated. In this case, the carrier composite 20 is retained. This singulation during cooling prevents significant bending of the carrier composite 20.

FIG. 1D does not show that the laser bar 30 in the cooled state is already singulated into the semiconductor laser diodes 3.

Subsequently, further predetermined breaking points 25 are created in the carrier composite 20 between adjacent carriers 2. The procedure used for creating the predetermined breaking points 25 is so-called stealth dicing. In this case, within the carrier composite 20 a damaged spot is produced in the material by means of non-linear absorption of a focussed, pulsed laser beam having a wavelength for which the carrier composite 20 is transparent at moderate intensities. Alternatively, the predetermined breaking points 25 can also be created by scribing or sawing.

Then, the carrier composite 20 is singulated into the individual semiconductor laser elements 1, see FIG. 1E. This is effected e.g. by breaking at an underside of the carrier 2 facing away from the light-emitting diodes 3 with a tool 7, which is wedge-shaped in cross-section, at the predetermined breaking points 25. In this case, a lateral offset between the singulation regions 9 between adjacent laser diodes 3 and the predetermined breaking points 25 in the carrier composite 20 is preferably in each case at the most 6 μm or 2 μm.

The completely singulated semiconductor laser elements 1 can be seen in a perspective view in FIG. 1F. In the direction away from the end side 27, the carrier 2 protrudes beyond the semiconductor laser diode 3. The semiconductor laser diode 3 and the carrier 2 have approximately equal widths. Lateral surfaces 29, 39 of the carrier 2 and of the semiconductor laser diode 3 comprise singulation tracks, not shown.

Preferably a further, preferably metallic contact point 5 is located on an underside of the carrier 2 facing away from the semiconductor laser diode 3. The carrier 2 is then preferably electrically conductive or comprises at least one via, not shown. Alternatively, the contact point 5, contrary to the illustration, can be located in the region of the carrier upper side 23 which protrudes beyond the semiconductor laser diode 3 in the direction away from the front side 37.

The optional holding strip 8, cf. FIG. 1C, can be removed before, during or after the method step in accordance with FIG. 1E. For this purpose, a further predetermined breaking point, not shown, is produced in the carrier composite 20 preferably perpendicularly with respect to the main emission direction E along a longitudinal axis of the carrier composite 20.

Figure 2:
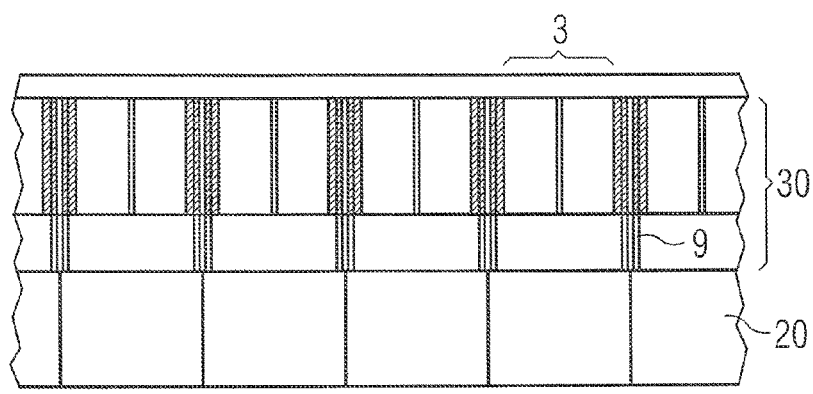
FIGS. 2A to 2D show a schematic view of a modification of a production method.
Figure 2:
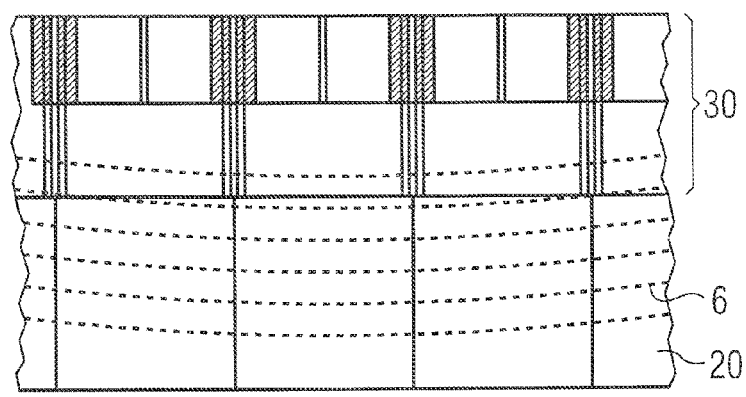
Figure 2:
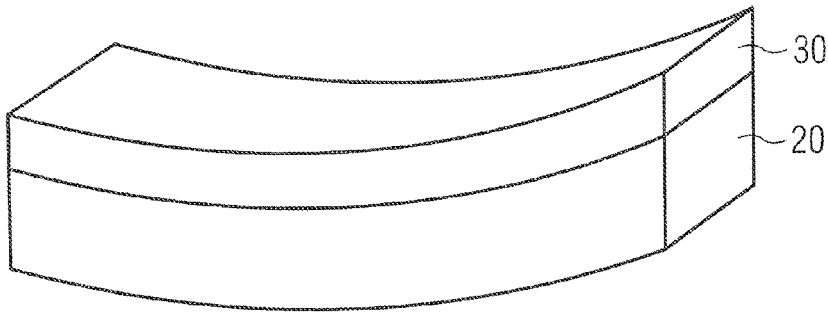
Figure 2:
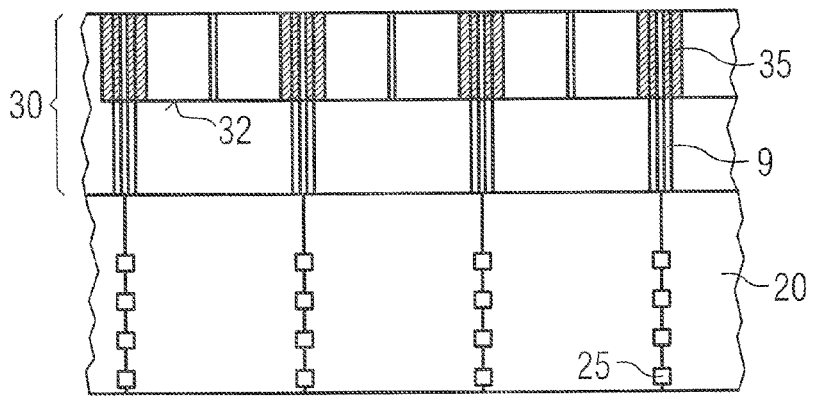

FIG. 2 illustrates a modification of a production method in perspective views. In the case of this modification, the carrier composite 20 consisting of silicon and the laser bar 30, based on GaAs, are firstly provided and then joined together, see FIG. 2A.

During cooling after joining together, mechanical stress is produced in the joined together component, symbolised in FIG. 2B by stress lines 6. When the component is in the cooled state, this results in a curvature, see FIG. 2C. This curvature, e.g. in the case of a laser bar 30 having a length of approximately 10 mm, amounts to approximately 25 µm. Therefore, the carrier composite 20 is curved in a bowl-like fashion. This makes handling more difficult. In particular, accuracy is reduced during subsequent manufacture of predetermined breaking points 25 in the carrier composite 20, cf. FIG. 2D.

After the component comprising the carrier composite 20 and the laser bar 30 is cooled, the predetermined breaking points 35 are formed in the laser bar 30 on a side facing away from the carrier composite 20. The predetermined breaking points 35 can then be located directly in the semiconductor layer sequence 32. In particular, the predetermined breaking points 35 are formed on a p-type side of the semiconductor layer sequence 32, on a side of the laser bar 30 facing away from the carrier composite 20.

Subsequently, the predetermined breaking points 25 are produced in the carrier composite 20, e.g. by means of stealth dicing. Then, the component can be singulated into the individual laser elements, in a similar manner to FIG. 1E. However, the curvature and the stress within the laser bar 30 make singulation by breaking more difficult because this stress counteracts the breaking.

The method described in conjunction with FIG. 1 facilitates singulation in particular during breaking. The method in accordance with FIG. 1 can thus be carried out more efficiently and the number of rejects can be significantly reduced.

The invention described herein is not limited by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A method for producing semiconductor laser elements comprising the steps of:
   A) providing at least one carrier composite having a plurality of carriers for the semiconductor laser elements;
   B) providing at least one laser bar having a plurality of semiconductor laser diodes which comprise a common growth substrate and a semiconductor layer sequence grown thereon, wherein the semiconductor layer sequence comprises an n-type side, a p-type side and an active zone located therebetween and the n-type side faces towards the common growth substrate;
   C) generating predetermined breaking points on a substrate underside of the common growth substrate, said substrate underside facing away from the semiconductor layer sequence;
   D) attaching the laser bar to a carrier upper side of the carrier composite, wherein the substrate underside of the common growth substrate faces towards the carrier upper side and wherein the attachment is performed at an attachment temperature and is followed by a cooling process, by which a temperature of the laser bar and of the carrier composite is reduced below the attachment temperature; and
   E) singulating into the semiconductor laser elements, wherein steps B) to E) are performed in the indicated sequence,
   wherein the carrier composite is manufactured from silicon, the common growth substrate is a GaAs substrate, the semiconductor layer sequence is based on AlIn-GaAsP, wherein in step D) the laser bar is attached to the carrier composite by soldering, the predetermined breaking points are produced in the common growth substrate in step C) by means of scribing, during the cooling process in step D) the temperature of the laser bar and of the carrier composite is reduced by at least 200° C., and prior to step E) during cooling in step D) the laser bar is simulated at least partially into the semiconductor laser diodes, wherein the carrier composite is retained.

2. The method according to claim 1, wherein after step D) further predetermined breaking points are formed between the carriers of the carrier composite by means of coherent radiation, and wherein in subsequent step E) the carrier composite is singulated into the carriers by means of breaking.

3. The method according to claim 1, wherein in subsequent step E) the carrier composite is singulated into the carriers by means of breaking and the breaking is effected via a breaking edge which is applied to a carrier underside facing away from the semiconductor layer sequence.

4. The method according to claim 1, wherein after step D) further predetermined breaking points are formed between the carriers of the carrier composite, and the further predetermined breaking points extend between 25% and 75% inclusive through the carrier composite, in the direction perpendicular to the carrier upper side.

5. The method according to claim 1, wherein a quotient from a thickness, which is equal to a sum of a thickness of the carriers and a thickness of the growth substrate, and from a width of the carriers is at least 0.8, and wherein a quotient from a length of the carriers and from the width of the carriers is at least 1.2.

6. The method according to claim 1, wherein finished semiconductor laser elements each comprise precisely one of the semiconductor laser diodes, wherein the semiconductor laser elements have a width between 100 µm and 350 µm inclusive, a length between 175 µm and 700 µm inclusive and a thickness between 125 µm and 450 µm inclusive, and wherein the laser bars in step D) have a length between 5 mm and 20 mm inclusive.

7. The method according to claim 1, wherein the common growth substrate and the semiconductor layer sequence are fragmented in singulation regions along the predetermined breaking points and wherein after step E) lateral surfaces of the fragmented common growth substrate, of the semiconductor layer sequence and of the carriers are oriented in parallel with one another and the carriers, the fragmented common growth substrate and the semiconductor layer sequence have equal widths and terminate flush with one another, each with a tolerance of at the most 6 μm.

8. The method according to claim 1, wherein the carrier composite protrudes beyond the laser bar in the direction perpendicular to and on a rear side opposite to an end side and a holding strip of the carrier composite is hereby formed, and wherein in or after step E) the holding strip is partially or completely removed and wherein a laser radiation is emitted at the end side during operation of the finished semiconductor laser diodes.

9. The method according to claim 1, wherein the growth substrate comprises a thermal expansion coefficient which is at least twice as large as a thermal expansion coefficient of the carrier composite.

10. The method according to claim 1, wherein metallisations on the carrier upper side or on the substrate underside are each limited to precisely one of the semiconductor laser diodes, and wherein the metallisations are spaced apart from a singulation region between adjacent semiconductor laser diodes.

11. The method according to claim 1, wherein a quotient from the length of the laser bar and a bend of the carrier composite is less than a value of 1200.

12. The method according to claim 1, wherein the laser bar in step D) comprises between 10 and 60 semiconductor laser diodes inclusive.

13. The method according to claim 1, wherein in each case precisely one of the semiconductor laser diodes is allocated to precisely one of the carriers of the carrier composite.

14. A semiconductor laser element which is produced by a method according to claim 1, comprising:
a carrier having an end side and having an upper side oriented perpendicularly with respect thereto, and
a semiconductor laser diode having a growth substrate and having a semiconductor layer sequence on the upper side for generating laser radiation,
wherein the carrier and the semiconductor laser diode have equal widths and lateral surfaces of the carrier and of the semiconductor laser diode terminate flush with one another, each with a tolerance of at the most 6 μm, and
wherein the lateral surfaces are oriented in parallel with one another and comprise singulation tracks.

15. The method according to claim 1, wherein the predetermined breaking points are formed in the growth substrate between the carrier composite and the semiconductor layer sequence.

16. A method for producing semiconductor laser elements comprising the steps of:
A) providing at least one carrier composite having a plurality of carriers for the semiconductor laser elements;
B) providing at least one laser bar having a plurality of semiconductor laser diodes which comprise a common growth substrate and a semiconductor layer sequence grown thereon, wherein the semiconductor layer sequence comprises an n-type side, a p-type side and an active zone located therebetween and the n-type side faces towards the common growth substrate;
C) generating predetermined breaking points on a substrate underside of the common growth substrate, said substrate underside facing away from the semiconductor layer sequence;
D) attaching the laser bar to a carrier upper side of the carrier composite, wherein the substrate underside of the common growth substrate faces towards the carrier upper side and wherein the attachment is performed at an attachment temperature and is followed by cooling process, by which a temperature of the laser bar and of the carrier composite is reduced below the attachment temperature; and
E) singulating into the semiconductor laser elements, wherein steps B) to E) are performed in the indicated sequence,
wherein the common growth substrate and the semiconductor layer sequence are fragmented in singulation regions along the predetermined breaking points and after step E) lateral surfaces of the fragmented common growth substrate, of the semiconductor layer sequence and of the carriers are oriented in parallel with one another and the carriers, the fragmented common growth substrate and the semiconductor layer sequence have equal widths and terminate flush with one another, each with a tolerance of at the most 6 μm.

17. A method for producing semiconductor laser elements comprising the steps of:
A) providing at least one carrier composite having a plurality of carriers for the semiconductor laser elements;
B) providing at least one laser bar having a plurality of semiconductor laser diodes which comprise a common growth substrate and a semiconductor layer sequence grown thereon, wherein the semiconductor layer sequence comprises an n-type side, a p-type side and an active zone located therebetween and the n-type side faces towards the common growth substrate;
C) generating predetermined breaking points on a substrate underside of the common growth substrate, said substrate underside facing away from the semiconductor layer sequence;
D) attaching the laser bar to a carrier upper side of the carrier composite, wherein the substrate underside of the common growth substrate faces towards the carrier upper side and wherein the attachment is performed at an attachment temperature and is followed by cooling process, by which a temperature of the laser bar and of the carrier composite is reduced below the attachment temperature; and
E) singulating into the semiconductor laser elements, wherein steps B) to E) are performed in the indicated sequence,
wherein the method for producing the semiconductor laser elements comprises one additional feature of the group consisting of additional features (i), (ii), (iii), (iv), (v) and (vi), namely:
i. wherein after step D) further predetermined breaking points are formed between the carriers of the carrier composite by means of coherent radiation, and wherein in subsequent step E) the carrier composite is singulated into the carriers by means of breaking,
ii. wherein in subsequent step E) the carrier composite is singulated into the carriers by means of breaking, wherein the breaking is effected via a breaking edge which is applied to a carrier underside facing away from the semiconductor layer sequence,
iii. wherein after step D) further predetermined breaking points are formed between the carriers of the carrier composite, wherein the further predetermined breaking points extend between 25% and 75% inclusive through the carrier composite, in the direction perpendicular to the carrier upper side,
iv. wherein the carrier composite protrudes beyond the laser bar in the direction perpendicular to and on a rear side opposite to an end side and a holding strip of the carrier composite is hereby formed, and wherein in or after step E) the holding strip is partially or completely removed and wherein a laser radiation is emitted at the end side during operation of the finished semiconductor laser diodes, v. wherein the common growth substrate comprises a thermal expansion coefficient which is at least twice as large as a thermal expansion coefficient of the carrier composite, and vi. wherein metallisations on the carrier upper side or on the substrate underside are each limited to precisely one of the semiconductor laser diodes, and wherein the metallisations are spaced apart from a singulation region between adjacent semiconductor laser diodes.

* * * * *